United States Patent
Wu et al.

(10) Patent No.: US 6,445,030 B1
(45) Date of Patent: Sep. 3, 2002

(54) FLASH MEMORY ERASE SPEED BY FLUORINE IMPLANT OR FLUORINATION

(75) Inventors: Yider Wu, San Jose, CA (US); Jean Y. Yang, Sunnyvale, CA (US); Hidehiko Shiraiwa, San Jose, CA (US); Che-Hoo Ng, San Martin, CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

(21) Appl. No.: 09/772,600

(22) Filed: Jan. 30, 2001

(51) Int. Cl.[7] ............................................. H01L 29/72
(52) U.S. Cl. ...................... 257/315; 257/299; 257/316; 257/321
(58) Field of Search ................................ 257/315, 316, 257/321, 299

(56) References Cited

U.S. PATENT DOCUMENTS

| | | | |
|---|---|---|---|
| 4,173,766 A | 11/1979 | Hayes | 357/23 |
| 5,168,334 A | 12/1992 | Mitchell et al. | 257/324 |
| 5,349,221 A | 9/1994 | Shimoji | 257/324 |
| 5,712,208 A | * 1/1998 | Tseng et al. | 257/316 |
| 5,768,192 A | 6/1998 | Eitan | 365/185.24 |
| 5,825,686 A | 10/1998 | Schmitt-Landsiedel et al. | 365/185.03 |
| 5,889,303 A | * 3/1999 | Eckert et al. | 257/316 |
| 5,966,603 A | 10/1999 | Eitan | 438/258 |
| 6,001,709 A | 12/1999 | Chuang et al. | 438/440 |
| 6,030,871 A | 2/2000 | Eitan | 438/276 |
| 6,093,607 A | 7/2000 | Hsieh et al. | 438/266 |

FOREIGN PATENT DOCUMENTS

| | | | |
|---|---|---|---|
| JP | 59069973 | 4/1984 | H01L/29/78 |
| JP | 1264268 | 10/1989 | H01L/29/78 |
| JP | 6085278 | 3/1994 | H01L/29/78 |

OTHER PUBLICATIONS

"A True Single–Transistor Oxide–Nitride–Oxide EEPROM Device," T.Y. Chan, et al., IEEE Electron Device Letters, vol. EDL 8, No. 3, Mar. 1987.

"An Electrically Alterable Nonvolatile Memory Cell Using a Floating–Gate Structure," Daniel C. Guterman, et al., IEEE Transactions on Electron Devices, vol. ED–26, No. 4, Apr. 1979.

"NROM: A Novel Localized Trapping, 2–Bit Nonvolatile Memory Cell," Boaz Eitan, et al., IEEE Electron Device Letters, vol. 21, No. 11 Nov. 2000.

* cited by examiner

Primary Examiner—Edward Wojciechowicz
(74) Attorney, Agent, or Firm—Amin & Turocy, LLP

(57) ABSTRACT

One aspect of the present invention relates to a non-volatile semiconductor memory device, containing a silicon substrate; a tunnel oxide layer over the silicon substrate, the tunnel oxide layer comprising fluorine atoms; a charge trapping layer over the tunnel oxide layer; an electrode or poly layer over the charge trapping layer; and source and drain regions within the silicon substrate. Another aspect of the present invention relates to a method of making a non-volatile semiconductor memory cell having improved erase speed, involving the steps of providing a silicon substrate; forming a tunnel oxide layer comprising fluorine atoms over the silicon substrate; and forming non-volatile memory cells over the tunnel oxide layer.

22 Claims, 3 Drawing Sheets

FLASH MEMORY ERASE SPEED BY FLUORINE IMPLANT OR FLUORINATION

TECHNICAL FIELD

The present invention generally relates to processing a non-volatile semiconductor memory device and non-volatile semiconductor memory devices having improved erase speed. In particular, the present invention relates to forming a memory device with a tunnel oxide containing fluorine to improve erase speed.

BACKGROUND ART

Semiconductor devices typically include multiple individual components formed on or within a substrate. Such devices often comprise a high density section and a low density section. For example, as illustrated in prior art FIG. 1, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NAND-type circuit configuration, such as, for example, the configuration illustrated in prior art FIG. 2. Each memory cell 14 has a drain 14a, a source 14b and a stacked gate 14c. A plurality of memory cells 14 connected together in series with a drain select transistor at one end and a source select transistor at the other end to form a NAND string as illustrated in prior art FIG. 2. Each stacked gate 14c is coupled to a word line (WL0, WL1, . . . , WLn) while each drain of the drain select transistors are coupled to a bit line (BL0, BL1, . . . , BLn). Lastly, each source of the source select transistors are coupled to a common source line Vss. Using peripheral decoder and control circuitry, each memory cell 14 can be addressed for programming, reading or erasing functions.

Prior art FIG. 3 represents a fragmentary cross section diagram of a typical memory cell 14 in the core region 11 of prior art FIGS. 1 and 2. Such a cell 14 typically includes the source 14b, the drain 14a and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, for example, prior art FIG. 2). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

The select transistors have a stacked gated structure similar to the memory cells, except that the first polysilicon layer (floating gate) and the second polysilicon layers (control gate) are shorted together to form a single gate type structure. Select gates typically ensure the selectivity of a particular bit line and prevent the memory cells from passing current during the program operation.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating. gate, the negative potential of the floating gate raises the threshold voltage ($V_{th}$) of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation may be induced by applying a high positive voltage to the source region and a 0 V to the control gate and the substrate while floating the drain of the respective memory cell.

Referring still to FIG. 3, conventional source erase operations for the flash memory cell 14 operate in the following manner. The memory cell 14 is programmed by applying a relatively high voltage $V_G$ to the control gate 20 and a moderately high voltage $V_D$ to the drain region 14a in order to produce "hot" electrons in the channel region 15 near the drain region 14a. The hot electrons accelerate across the tunnel oxide 17 and into the floating gate 18 and become trapped in the floating gate 18 since the floating gate 18 is surrounded by insulators (the interpoly dielectric 19 and the tunnel oxide 17). As a result of the trapped electrons, the threshold voltage of the memory cell 14 increases. This change in the threshold voltage (and thereby the channel conductance) of the memory cell 14 created by the trapped electrons causes the cell to be programmed.

To read the flash memory cell 14, a predetermined voltage $V_G$ that is greater than the threshold voltage of an unprogrammed cell, but less than the threshold voltage of a programmed cell, is applied to the control gate 20. If the memory cell 14 conducts, then the memory cell 14 has not been programmed (the cell 14 is therefore at a first logic state, e.g., a zero "0"). Likewise, if the memory cell 14 does not conduct, then the memory cell 14 has been programmed (the cell 14 is therefore at a second logic state, e.g., a one "1"). Consequently, it is possible to read each cell 14 to determine whether or not it has been programmed (and therefore identify its logic state).

In order to erase the flash memory cell 14, a relatively high voltage $V_S$ is applied to the source region 14b and a lower voltage or ground is applied to the control gate 20, while the drain region 14a is allowed to float. Under these conditions, a strong electric field is developed across the tunnel oxide 17 between the floating gate 18 and the source region 14b. The electrons that are trapped in the floating gate 18 flow toward and cluster at the portion of the floating gate 18 overlying the source region 14b and are extracted from the floating gate 18 and into the source region 14b by way of Fowler-Nordheim tunneling through the tunnel oxide 17. Consequently, as the electrons are removed from the floating gate 18, the memory cell 14 is erased.

One aspect of a non-volatile memory cell is erase speed. It is desirable for non-volatile memory cells to exhibit not only consistent but also fast erase times. After cycling, that is numerous program and erase cycles, erase speed of non-volatile memory cells tends to decrease (erase time increases with increasing cycling). In some instances, a build-up of charges in or near the floating gate after cycling undesirably causes an increase in erase time.

In other instances, the tunnel oxide layer is subject to a nitridation process. Nitridation introduces nitrogen atoms, typically having a positive charge, into the oxide layer. The purpose of nitridation is to improve the resistance of the oxide layer to degradation. However, nitridation often results in slower erase speeds in memory cells positioned over nitrided tunnel oxide layers.

SUMMARY OF THE INVENTION

The present invention provides non-volatile semiconductor memory devices characterized by improved erase times, even after numerous program and erase cycles. Improved erase times involves at least one of consistent erase times over the course of cycling and fast erase times (both faster initial erase times and faster erase times after cycling). The non-volatile semiconductor memory devices of the present invention may further exhibit a higher voltage drop during an identical erase time compared to a conventional non-volatile semiconductor memory device not made in accordance with the present invention.

One aspect of the present invention relates to a non-volatile semiconductor memory device having improved erase speed, containing a silicon substrate; a tunnel oxide layer over the silicon substrate, the tunnel oxide layer comprising fluorine atoms; a charge trapping layer over the tunnel oxide layer; an electrode or poly layer over the charge trapping layer; and source and drain regions within the silicon substrate.

Another aspect of the present invention relates to a SONOS type non-volatile semiconductor memory device containing at least one SONOS type non-volatile semiconductor memory cell, the memory cell containing a tunnel oxide layer over a silicon substrate, the tunnel oxide layer comprising fluorine atoms so as to improve erase speed; a charge trapping dielectric layer over the tunnel oxide layer; an electrode or poly layer over the charge trapping dielectric layer; and source and drain regions within the silicon substrate.

Yet another aspect of the present invention relates to a method of making a non-volatile semiconductor memory cell having improved erase speed, involving the steps of providing a silicon substrate; forming a tunnel oxide layer comprising fluorine atoms over the silicon substrate; and forming non-volatile memory cells over the tunnel oxide layer.

Still yet another aspect of the present invention relates to a method of increasing erase speed in a SONOS type non-volatile memory cell, involving the steps of forming a tunnel oxide layer comprising fluorine atoms so as to improve erase speed over a silicon substrate; forming a charge trapping dielectric over the tunnel oxide layer; forming an electrode or poly layer over the charge trapping dielectric; and forming source and drain regions.

DISCLOSURE OF INVENTION

Figure 1:
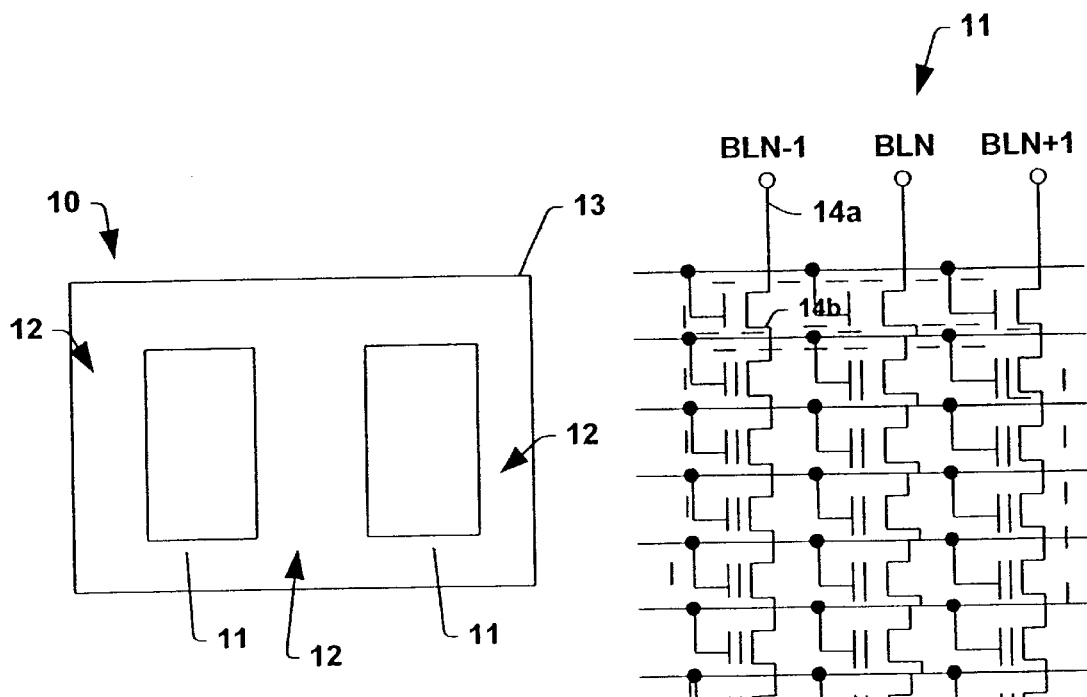
FIG. 1 illustrates a top down view of a prior art non-volatile semiconductor memory device.
Figure 2:
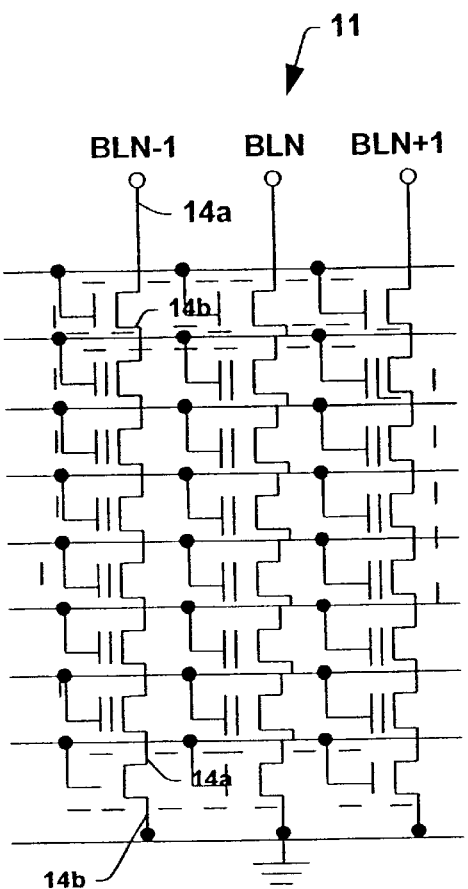
FIG. 2 illustrates a circuit diagram of a prior art non-volatile semiconductor memory device.
Figure 3:
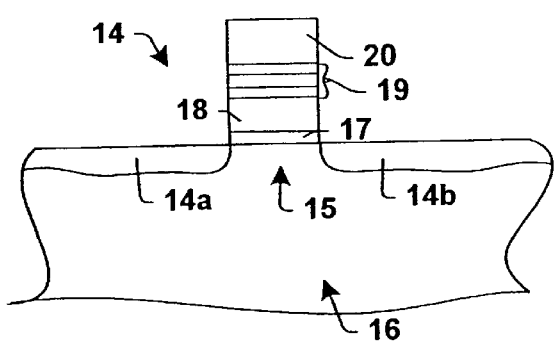
FIG. 3 illustrates a cross sectional view of a prior art non-volatile semiconductor memory cell.

The present invention involves improving erase times for non-volatile semiconductor memory devices by introducing negative charge into the tunnel oxide. While not wishing to be bound by any theory, it is believed that the negative charge in the tunnel oxide renders the tunnel oxide more conductive and increases erase speed and/or makes the erase speed consistent over extensive program-erase cycles by increasing the voltage drop (Vt erased−Vt initial). At least one of the initial erase speed and the erase speed after cycling (for example, after 10 k cycles) is improved.

The tunnel oxide layer in accordance with the present invention has negative charge since it is made using fluorine. The tunnel oxide layer contains silicon dioxide or silicon oxynitride and a species that imparts negative charge thereto. In one optional embodiment, the tunnel oxide contains a nitrided oxide layer. In another optional embodiment, the tunnel oxide contains an oxygen-rich oxide layer. In yet another optional embodiment, the tunnel oxide contains a silicon-rich oxide layer. The presence of fluorine in the tunnel oxide layer accounts for the negative charge. The tunnel oxide layer in accordance with the present invention is formed over the entire substrate (in both the periphery and core regions) or over at least the core region of the substrate.

Generally speaking, the tunnel oxide layer containing negative charge is formed in any suitable manner, but typically the tunnel oxide layer in accordance with the present invention may be formed in one of three manners. In a first embodiment, fluorine is implanted into the silicon substrate, followed by oxide formation over the substrate. In a second embodiment, oxide is formed over the silicon substrate, followed by fluorine implantation into the oxide layer. In a third embodiment, an oxide layer is formed in a fluorine ambient.

In the first embodiment, fluorine is initially implanted into the silicon substrate where it diffuses into the subsequently formed oxide layer. Diffusion may be induced or promoted by heating or annealing the structure. Diffusion may also be induced or promoted by the processing conditions associated with forming the oxide layer. For example, fluorine is implanted in the silicon substrate at a concentration from about $1\times10^{12}$ to about $1\times10^{16}$ atoms/cm$^2$ at an energy level from about 20 keV to about 80 keV. In another embodiment, fluorine is implanted in the silicon substrate at a concentration from about $1\times10^{13}$ to about $1\times10^{15}$ atoms/cm$^2$ at an energy level from about 25 keV to about 70 keV.

The oxide layer is formed over all or a portion of the implanted silicon substrate using any suitable means, such as chemical vapor deposition (CVD), dry oxidation, wet oxidation or rapid thermal oxidation. Dry oxidation, wet oxidation, and rapid thermal oxidation are preferred, especially when the tunnel oxide layer contains silicon dioxide. CVD techniques are employed in instances where the tunnel oxide layer contains silicon dioxide or silicon oxynitride.

Dry oxidation, wet oxidation, and rapid thermal oxidation involve heating the structure at a temperature from about 600° C. to about 1,200° C. for a time from about 2 seconds to about 10 minutes. In another embodiment, dry oxidation, wet oxidation, and rapid thermal oxidation involve heating the structure at a temperature from about 800° C. to about 1,100° C. for a time from about 10 seconds to about 5 minutes. The atmosphere in dry oxidation and rapid thermal oxidation contains at least oxygen and optionally one or more inert gases. The atmosphere in wet oxidation contains at least oxygen, water vapor, and optionally one or more inert gases. Oxide growth may be conducted in a one step process, a two step process (two or more growth steps), a three step process and so on.

Optionally, the structure with the oxide layer is subject to heat treatment, such as baking or annealing, to promote or induce diffusion of the fluorine into the oxide layer from the silicon substrate. For example, the structure is heated to a temperature from about 500° C. to about 1,200° C. for a time from about 1 second to about 10 minutes. The heat treatment is optional since the heat associated with oxide formation may induce or promote diffusion of fluorine into the oxide layer.

In the second embodiment, an oxide layer is formed over the silicon substrate, followed by fluorine implantation into the oxide layer. The oxide layer is formed over the silicon substrate using any suitable means, such as CVD, dry oxidation, wet oxidation or rapid thermal oxidation. Dry oxidation, wet oxidation, and rapid thermal oxidation are preferred, especially when the tunnel oxide layer contains silicon dioxide. Dry oxidation, wet oxidation, and rapid thermal oxidation involve heating the structure at a temperature from about 600° C. to about 1,200° C. for a time from about 2 seconds to about 10 minutes. In another embodiment, dry oxidation, wet oxidation, and rapid thermal oxidation involve heating the structure at a temperature from about 800° C. to about 1,100° C. for a time from about 10 seconds to about 5 minutes. The atmosphere in dry oxidation and rapid thermal oxidation contains at least oxygen and optionally one or more inert gases. The atmosphere in wet oxidation contains at least oxygen, water vapor, and optionally one or more inert gases. Oxide growth may be conducted in a one step process, a two step process (two or more growth steps), a three step process and so on.

After oxide layer formation, fluorine is implanted in the oxide layer at a concentration from about $1\times10^{12}$ to about $1\times10^{16}$ atoms/cm$^2$ at an energy level from about 20 keV to about 80 keV. In another embodiment, fluorine is implanted in the oxide layer at a concentration from about $1\times10^{13}$ to about $1\times10^{15}$ atoms/cm$^2$ at an energy level from about 25 keV to about 70 keV.

In the third embodiment, an oxide layer is formed over the silicon substrate in a fluorine ambient. In particular, the oxide layer is grown in an atmosphere containing a fluorine compound. Examples of fluorine compounds include fluorine, hydrofluoric acid, fluorosilicic acid, difluorosilane, and the like. The oxide layer is grown over the silicon substrate using any suitable means, such as dry oxidation, wet oxidation or rapid thermal oxidation.

Dry oxidation, wet oxidation, and rapid thermal oxidation involve heating the structure at a temperature from about 600° C. to about 1,200° C. for a time from about 2 seconds to about 10 minutes. In another embodiment, dry oxidation, wet oxidation, and rapid thermal oxidation involve heating the structure at a temperature from about 800° C. to about 1,100° C. for a time from about 10 seconds to about 5 minutes. The atmosphere in dry oxidation and rapid thermal oxidation contains at least oxygen, a fluorine compound, and optionally one or more inert gases. The atmosphere in wet oxidation contains at least oxygen, a fluorine compound, water vapor, and optionally one or more inert gases. Oxide growth may be conducted in a one step process, a two step process (two or more growth steps), a three step process and so on. In embodiments where two or more growth steps are employed, at least one of the growth steps is conducted in a fluorine ambient.

The oxide layer is grown in the atmosphere containing the fluorine compound has a concentration of fluorine from about $1\times10^{12}$ to about $1\times10^{16}$ atoms/cm$^2$. In another embodiment, the oxide layer is grown in the atmosphere containing the fluorine compound has a concentration of fluorine from about $1\times10^{13}$ to about $1\times10^{15}$ atoms/cm$^2$.

Irrespective of how the tunnel oxide layer containing negative charge is formed, in one embodiment, the thickness of the tunnel oxide layer is from about 30 Å to about 300 Å. In another embodiment, the thickness of the tunnel oxide layer is from about 40 Å to about 250 Å. In yet another embodiment, the thickness of the tunnel oxide layer is from about 50 Å to about 225 Å.

The present invention may be employed for non-volatile semiconductor memory devices having any configuration, including a NOR or NAND type configuration. The present invention may also be implemented by any of ROMs (read only memories), PROMs (programable read only memories), EPROMs (erasable programable read only memories), and EEPROMs (electrically erasable programable read only memories).

Figure 4:
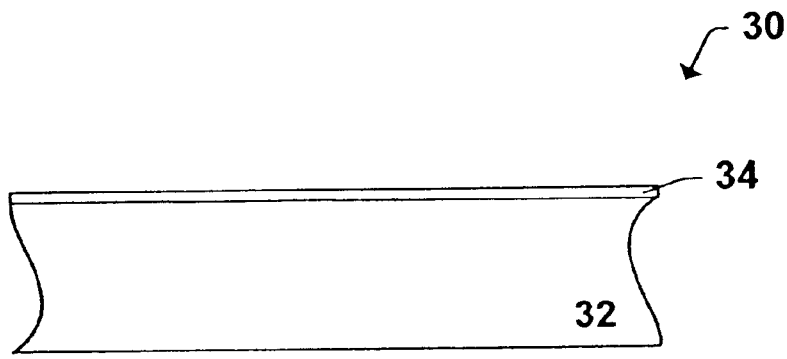
FIG. 4 illustrates a cross sectional view of making a non-volatile semiconductor memory cell in accordance with one aspect of the present invention.
Figure 5:
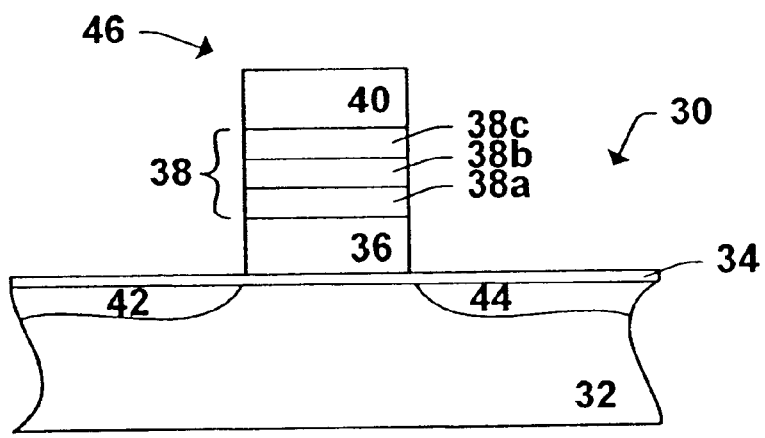
FIG. 5 illustrates a cross sectional view of a non-volatile semiconductor memory cell in accordance with one aspect of the present invention.
Figure 6:
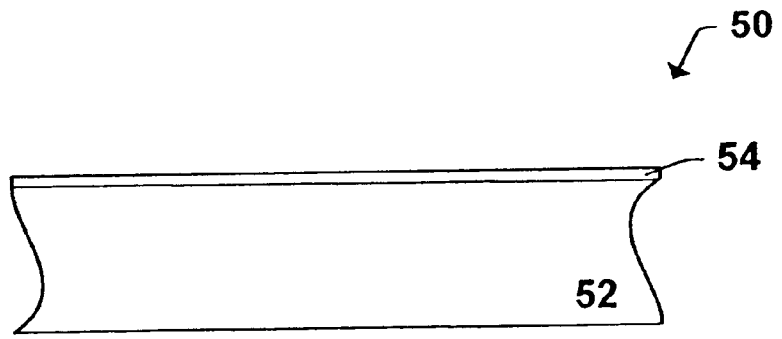
FIG. 6 illustrates a cross sectional view of making a non-volatile semiconductor memory cell in accordance with one aspect of the present invention.
Figure 7:
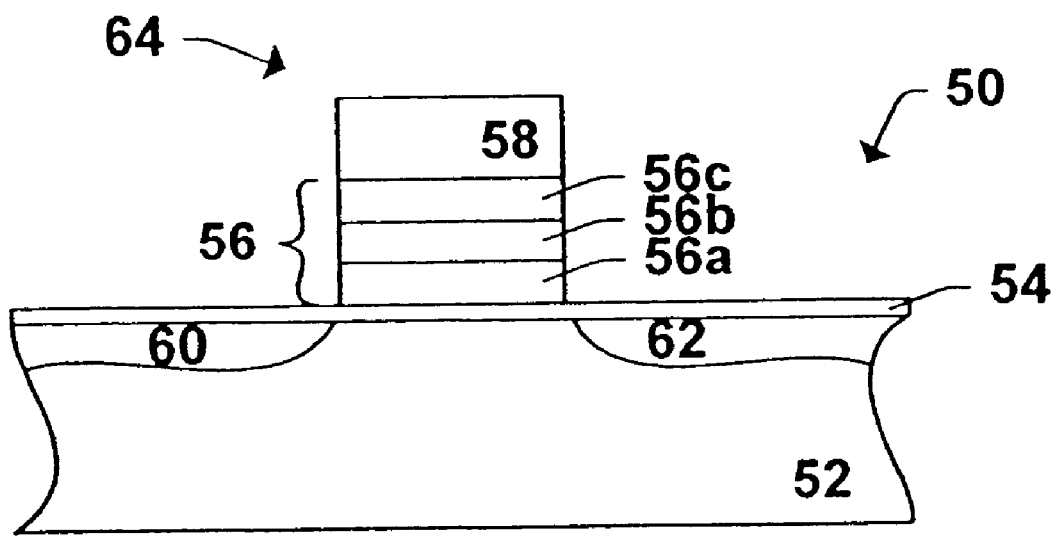
FIG. 7 illustrates a cross sectional view of a non-volatile semiconductor memory cell in accordance with one aspect of the present invention.

The present invention is now described in connection with FIGS. 4 to 7. FIG. 4 and 5 show one embodiment, while FIGS. 6 and 7 show another embodiment. Referring to FIG. 4, a structure 30 of a P-type substrate 32 is initially provided. An oxide layer 34 having a negative charge is formed over the substrate 32. The oxide layer 34 subsequently forms the tunnel oxide layer of a memory cell.

The oxide layer 34 is formed using a thermal growth process, preferably in a dry oxidation furnace, followed by fluorine implantation. For instance, a two step oxidation process including a first dry oxidation at a temperature of about 900° C., under an atmosphere of oxygen, HCl, and argon, and second a dry oxidation at a temperature of about 1050° C., under an atmosphere of oxygen, HCl, and argon to provide an oxide layer having a thickness of about 100 Å is initially employed. Then, fluorine is implanted into the oxide layer 34 at a concentration of about $1\times10^{14}$ atoms/cm$^2$ at an energy level of about 30 keV.

Referring to FIG. 5, conventional processing is employed to form a plurality of memory cells 46 over the structure 30 to provide a memory device. Memory cell 46 includes tunnel oxide layer 34, source and drain regions 42 and 44, electrode/poly 1 layer 36, interpoly dielectric 38, and electrode/poly 2 layer 40. Although not shown, the tunnel oxide layer 34 may be present only under the memory cells 46. The poly 1 layer and poly 2 layer may independently contain polysilicon, doped polysilicon, doped amorphous silicon, or a refractory metal silicide such as tungsten silicide, titanium silicide, and tantalum silicide. The interpoly dielectric 38 is preferably a three layer region of oxide/nitride/oxide (a so called "ONO" layer) and typically has a total thickness from about 100 Å to about 400 Å. The poly 1 layer 36 and poly 2 layer 40 independently have a thickness from about 700 Å to about 1,200 Å. Ion implantation and annealing typically complete the formation of the source and drain regions 42 and 44.

Although not shown, additional layers and contacts may be formed thereover. For example, a tungsten suicide layer, a poly-cap layer, a silicon oxynitride layer, an interlevel oxide layer and/or an encapsulating layer may be formed over the structure 30.

Referring to FIG. 6, a structure 50 of a P-type substrate 52 is initially provided. An oxide layer 54 having a negative charge is formed over the substrate 52. The oxide layer 54 subsequently forms the tunnel oxide layer of a memory cell.

The oxide layer 54 having a negative charge is formed by implanting fluorine into the substrate and then growing an oxide layer, preferably in a dry oxidation furnace. For instance, fluorine is implanted into the substrate 52 at a concentration of about $5\times10^{14}$ atoms/cm$^2$ at an energy level of about 50 keV. An oxide layer is grown over the substrate 52 using dry oxidation at a temperature of about 1,000° C., under an atmosphere of oxygen, HCl, and argon. Optionally, the structure 50 is annealed at a temperature of about 1,100° C. to promote diffusion of the fluorine into the oxide layer.

Referring to FIG. 7, non-volatile memory processing is employed to form a plurality of memory cells 64 over the structure 50 to provide a memory device. Memory cell 64 includes tunnel oxide layer 54, source and drain regions 60 and 62, charge trapping dielectric 56, and electrode or poly 1 layer 58. Although not shown, the tunnel oxide layer 54 may be present only under the memory cells 64, where it may or may not be part of the charge trapping dielectric 56.

The electrode or poly 1 layer may contain polysilicon, doped polysilicon, doped amorphous silicon, and a refractory metal silicide such as tungsten silicide, titanium silicide, and tantalum silicide. The charge trapping dielectric 56 is preferably a three layer region of oxide/nitride/oxide (56a, 56b, 56c, a so called "ONO" layer) and typically has a total thickness from about 75 Å to about 300 Å. In another embodiment, the charge trapping dielectric 56 has a total thickness from about 90 Å to about 250 Å. The poly 1 layer 58 has a thickness from about 500 Å to about 5,000 Å. In another embodiment, the poly 1 layer 58 has a thickness from about 1,000 Å to about 4,000 Å. Ion implantation and annealing typically complete the formation of the source and drain regions 60 and 62.

In this embodiment, the memory cell 64 is a SONOS (Silicon Oxide Nitride Oxide Silicon) type memory cell. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium.

The charge trapping dielectric 56, may be any dielectric layer or layers that are capable of or facilitate electron trapping. In other words, to facilitate electron trapping, the charge trapping dielectric 56 has a layer with a lower barrier height than the layers sandwiching it (two layers with relatively higher barrier heights sandwiching a layer with a relatively lower barrier height). In the case of an ONO trilayer dielectric, the oxide layers have a barrier height of about 3.1 eV whereas the nitride layer has a barrier height of about 2.1 eV. In this connection, a well is created in the middle layer.

Examples of charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/haftiium oxide/oxide trilayer dielectric, and the like (in each case, the first layer mentioned is the bottom layer while the last layer mentioned is the top layer).

Although the term SONOS type nonvolatile memory device is used herein, it is to be understood that a SONOS type nonvolatile memory device as used herein may contain any of the charge trapping dielectrics described above. In other words, a SONOS type nonvolatile memory device contains any dielectric layer or layers that are capable of or facilitate electron trapping, and the SONOS type nonvolatile memory device contains an ONO charge trapping dielectric only when a specific reference to such dielectric is indicated.

Moreover, in the embodiments where the charge trapping dielectric is an ONO dielectric, one or both of the silicon dioxide layers 56a and 56c may be a silicon-rich silicon dioxide layer. One or both of the silicon dioxide layers 56a and 56c may also be an oxygen-rich silicon dioxide layer. One or both of the silicon dioxide layers 56a and 56c may be a thermally grown or a deposited oxide. One or both of the silicon dioxide layers 56a and 56c may be nitrided oxide layers. The nitride 56b may be a silicon-rich silicon nitride layer. The nitride 56b may also be an nitrogen-rich silicon nitride layer.

Although not shown, additional layers and contacts may be formed thereover. For example, a tungsten silicide layer, a poly-cap layer, a silicon oxynitride layer, an interlevel oxide layer and/or an encapsulating layer may be formed over the structure 50.

In one embodiment, the erase time of a non-volatile memory cell in accordance with the present invention is less than about 500 milliseconds after 10 k program-erase cycles. In another embodiment, the erase time of a non-volatile memory cell in accordance with the present invention is less than about 100 milliseconds after 10 k program-erase cycles. In yet another embodiment, the erase time of a non-volatile memory cell in accordance with the present invention is less than about 500 milliseconds after 100 k program-erase cycles. In still yet another embodiment, the erase time of a non-volatile memory cell in accordance with the present invention is less than about 100 milliseconds after 100 k program-erase cycles.

In one embodiment, the initial erase time of a non-volatile memory cell in accordance with the present invention is less than about 500 milliseconds. In another embodiment, the initial erase time of a non-volatile memory cell in accordance with the present invention is less than about 100 milliseconds.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A non-volatile semiconductor memory device, comprising:

a silicon substrate; and

SONOS type non-volatile memory cells having improved erase speed on the substrate, each SONOS type memory cell comprising:

a tunnel oxide layer having a thickness from about 40 Å to about 250 Å comprising from about $1 \times 10^{13}$ to about $1 \times 10^{15}$ fluorine atoms/cm$^2$;

a charge trapping dielectric layer over the tunnel oxide layer;

an electrode over the charge trapping layer; and source and drain regions within the silicon substrate.

2. The non-volatile semiconductor memory device according to claim 1, wherein the SONOS type non-volatile memory cells have an initial erase time of less than about 500 milliseconds.

3. The non-volatile semiconductor memory device according to claim 1, wherein the SONOS type non-volatile memory cells have an erase time of less than about 500 milliseconds after 10,000 program-erase cycles.

4. The non-volatile semiconductor memory device according to claim 1, wherein the charge trapping dielectric layer comprises at least one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

5. The non-volatile semiconductor memory device according to claim 1, wherein the charge trapping dielectric layer comprises an ONO dielectric comprising at least one of a nitrided oxide layer and a silicon-rich silicon nitride layer.

6. The non-volatile semiconductor memory device according to claim 1, wherein the electrode comprises one of polysilicon, doped polysilicon, doped amorphous silicon, and; a refractory metal silicide.

7. A SONOS type non-volatile semiconductor memory device comprising at least one SONOS type non-volatile semiconductor memory cell, comprising:

a tunnel oxide layer over a silicon substrate, the tunnel oxide layer having a thickness from about 40 Å to about 250 Å comprising from about $1 \times 10^{13}$ to about $1 \times 10^{15}$ fluorine atoms/cm$^2$;

an ONO charge trapping dielectric layer over the tunnel oxide layer;

an electrode over the ONO charge trapping dielectric layer; and source and drain regions within the silicon substrate.

8. The SONOS type non-volatile semiconductor memory device according to claim 7, wherein the SONOS type non-volatile memory cells have an initial erase time of less than about 100 milliseconds.

9. The SONOS type non-volatile semiconductor memory device according to claim 7, wherein the SONOS type non-volatile memory cells have an erase time of less than about 100 milliseconds after 10,000 program-erase cycles.

10. The SONOS type non-volatile semiconductor memory device according to claim 7, wherein the SONOS type non-volatile memory cells have an erase time of less than about 500 milliseconds after 100,000 program-erase cycles.

11. The SONOS type non-volatile semiconductor memory device according to claim 7, wherein the charge trapping dielectric layer comprises an ONO dielectric comprising at least one of a nitrided oxide layer and a silicon-rich silicon nitride layer.

12. The SONOS type non-volatile semiconductor memory device according to claim 7, wherein the electrode comprises one of polysilicon, doped polysilicon, doped amorphous silicon, and a refractory metal silicide.

13. A method of making a SONOS type non-volatile semiconductor memory cell having improved erase speed, comprising:

providing a silicon substrate;

forming a tunnel oxide layer having a thickness from about 40 Å to about 250 Å comprising from about $1 \times 10^{13}$ to about $1 \times 10^{15}$ fluorine atoms/cm$^2$ over the silicon substrate;

forming a charge trapping dielectric over the tunnel oxide layer;

forming an electrode over the charge trapping dielectric;

forming source and drain regions; and forming SONOS type non-volatile memory cells having improved erase speed over the tunnel oxide layer.

14. The method according to claim 13, wherein the tunnel oxide layer is formed by implanting fluorine into the silicon substrate, and growing an oxide layer over the fluorine implanted silicon substrate.

15. The method according to claim 14, wherein forming the tunnel oxide layer further comprises heating the oxide layer positioned over the fluorine implanted silicon substrate.

16. The method according to claim 13, wherein the tunnel oxide layer is formed by forming an oxide layer over the silicon substrate, and implanting fluorine into the oxide layer.

17. The method according to claim 13, wherein the tunnel oxide layer is formed by growing an oxide layer over the silicon substrate in an atmosphere comprising a fluorine compound.

18. A method of increasing erase speed in a SONOS type non-volatile memory cell, comprising:

forming a tunnel oxide layer having a thickness from about 40 Å to about 250 Å comprising from about $1 \times 10^{13}$ to about $1 \times 10^{15}$ fluorine atoms/cm$^2$ over a silicon substrate;

forming an ONO charge trapping dielectric over the tunnel oxide layer;

forming an electrode over the ONO charge trapping dielectric;

forming source and drain regions; and forming SONOS type non-volatile memory cells having increased erase speed over the tunnel oxide layer.

19. The method according to claim 18, wherein the tunnel oxide layer is formed by implanting fluorine into the silicon substrate at a dosage from about $1\times10^{13}$ to about $1\times10^{15}$ atoms/cm$^2$ at an energy level from about 20 keV to about 80 keV, and growing an oxide layer over the fluorine implanted silicon substrate at a temperature from about 600° C. to about 1,200° C.

20. The method according to claim 18, wherein the tunnel oxide layer is formed by forming an oxide layer over the silicon substrate, and implanting fluorine into the oxide layer at a dosage from about $1\times10^{13}$ to about $1\times10^{15}$ atoms/cm$^2$ at an energy level from about 20 keV to about 80 keV.

21. The method according to claim 18, wherein the tunnel oxide layer is formed by growing an oxide layer over the silicon substrate in an atmosphere comprising a fluorine compound at a temperature from about 600° C. to about 1,200° C.

22. The method according to claim 13, wherein the charge trapping dielectric comprises at least one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

* * * * *